US012563972B2

(12) United States Patent
Wu et al.

(10) Patent No.: US 12,563,972 B2
(45) Date of Patent: Feb. 24, 2026

(54) MAGNETIC TUNNEL JUNCTION PILLAR FORMATION FOR MRAM DEVICE

(71) Applicant: International Business Machines Corporation, Armonk, NY (US)

(72) Inventors: Heng Wu, Guilderland, NY (US); Pouya Hashemi, Purchase, NY (US); Ruilong Xie, Niskayuna, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 929 days.

(21) Appl. No.: 17/545,485

(22) Filed: Dec. 8, 2021

(65) Prior Publication Data

US 2023/0180623 A1 Jun. 8, 2023

(51) Int. Cl.
| | |
|---|---|
| *H01L 43/08* | (2006.01) |
| *H10B 61/00* | (2023.01) |
| *H10N 50/01* | (2023.01) |
| *H10N 50/10* | (2023.01) |
| *H10N 50/80* | (2023.01) |

(52) U.S. Cl.
CPC ............. *H10N 50/10* (2023.02); *H10B 61/00* (2023.02); *H10N 50/01* (2023.02); *H10N 50/80* (2023.02)

(58) Field of Classification Search
CPC ........ H10N 50/10; H10N 50/01; H10N 50/80; H10B 61/00
See application file for complete search history.

(56) References Cited

U.S. PATENT DOCUMENTS

| | | | |
|---|---|---|---|
| 7,319,262 B2 | 1/2008 | Liu et al. |
| 7,880,249 B2 | 2/2011 | Yuan et al. |
| 8,063,393 B2 | 11/2011 | Chen |
| 8,273,582 B2 | 9/2012 | Nozieres et al. |
| 8,334,213 B2 | 12/2012 | Mao |
| 8,883,520 B2 | 11/2014 | Satoh et al. |

(Continued)

FOREIGN PATENT DOCUMENTS

| | | |
|---|---|---|
| EP | 4445702 A1 | 10/2024 |
| TW | I848339 B | 7/2024 |
| WO | 2023/104453 A1 | 6/2023 |

OTHER PUBLICATIONS

International Search Report and Written Opinion dated Mar. 17, 2023, received on Mar. 20, 2023 from related PCT/EP2002/082079.

*Primary Examiner* — Mohammed R Alam
(74) *Attorney, Agent, or Firm* — Scully, Scott, Murphy & Presser, P.C.; Yuanmin Cai

(57) ABSTRACT

A method of manufacturing an MRAM device includes forming an MTJ stack on a substrate, forming a hardmask layer on the MTJ stack, forming etch pattern pads on the hardmask, forming a spacer on the sides of the etch pattern pads to form first openings exposing the hardmask, patterning the MTJ stack by a first etch using the first openings to form a plurality of first MTJ pillars separated by first vias, filling the first vias with a first dielectric, removing the spacers from the etch pattern pads to form a plurality of second openings between the first dielectric and the etch pattern pads, patterning the plurality of first MTJ pillars by a second etch using the second openings to form a plurality of second MTJ pillars separated by second vias and filling the second vias with a second dielectric to encapsulate the plurality of second MTJ pillars.

10 Claims, 5 Drawing Sheets

(56)                    References Cited

U.S. PATENT DOCUMENTS

|  |  |  |  |
|---|---|---|---|
| 9,705,071 | B2 | 7/2017 | Annunziata et al. |
| 10,475,496 | B1 | 11/2019 | Annunziata et al. |
| 2013/0244344 | A1 | 9/2013 | Malmhall et al. |
| 2013/0267042 | A1 | 10/2013 | Satoh et al. |
| 2016/0308119 | A1 | 10/2016 | Hsu et al. |
| 2017/0062520 | A1* | 3/2017 | Sato ..................... H10N 50/01 |
| 2019/0207080 | A1 | 7/2019 | Shrivsatava et al. |
| 2020/0075847 | A1 | 3/2020 | Yang et al. |
| 2020/0144495 | A1 | 5/2020 | Annunziata et al. |
| 2021/0091306 | A1 | 3/2021 | Dutta et al. |
| 2021/0098530 | A1 | 4/2021 | Manfrini et al. |
| 2021/0126051 | A1 | 4/2021 | Dutta et al. |
| 2021/0375986 | A1 | 12/2021 | Dutta et al. |

* cited by examiner

10

MAGNETIC TUNNEL JUNCTION PILLAR FORMATION FOR MRAM DEVICE

BACKGROUND

The present disclosure relates to magnetoresistive random-access ("MRAM") memory device cells including magnetic tunnel junction ("MTJ") stacks and methods of manufacturing MRAM devices.

Current MRAM MTJ pillar formation requires aggressive IBE etch to remove the metal residues on the MTJ sidewall, which causes shorts. Too strong IBE can gouge into the NBLOK and touch the Cu bottom contact, leading to Cu exposure, migration and oxidation. A large IBE opening during pillar formation will cause NBLOK loss due to the loading effect. Therefore, prior solutions require a mild IBE to avoid too much NBLOK loss. However, a reduction in the IBE budget, with a post etching oxidation to oxidize the metal residues will introduce significant MTJ sidewall damage.

SUMMARY

Embodiments of the present disclosure relate to a method of manufacturing an MRAM device having magnetic tunnel junction (MTJ) pillars that include forming a plurality of layers defining an MTJ stack on a substrate, forming a metal hardmask layer on the MTJ stack, forming a plurality of etch pattern pads on the metal hardmask layer, forming a spacer on the sides of the plurality of etch pattern pads to form a plurality of first openings exposing the hardmask layer, patterning the MTJ stack by a first etch using the first openings to form a plurality of first MTJ pillars separated by first vias, filling the first vias with a first dielectric, removing the spacers from the plurality of etch pattern pads to form a plurality of second openings between the first dielectric and the plurality of etch pattern pads, patterning the plurality of first MTJ pillars by a second etch using the second openings to form a plurality of second MTJ pillars separated by second vias and filling the second vias with a second dielectric to encapsulate the plurality of second MTJ pillars.

Embodiments of the present disclosure relate to MRAM devices having magnetic tunnel junction (MTJ) pillars, that include a plurality of MTJ pillars on a substrate, a first dielectric between pairs of MTJ pillars defining two vias between each pair of MTJ pillars and a second dielectric filling the pairs of vias and encapsulating the plurality of MTJ pillars.

Further features as well as the structure and operation of various embodiments are described in detail below with reference to the accompanying drawings. In the drawings, like reference numbers indicate identical or functionally similar elements.

DETAILED DESCRIPTION

Figure 1:
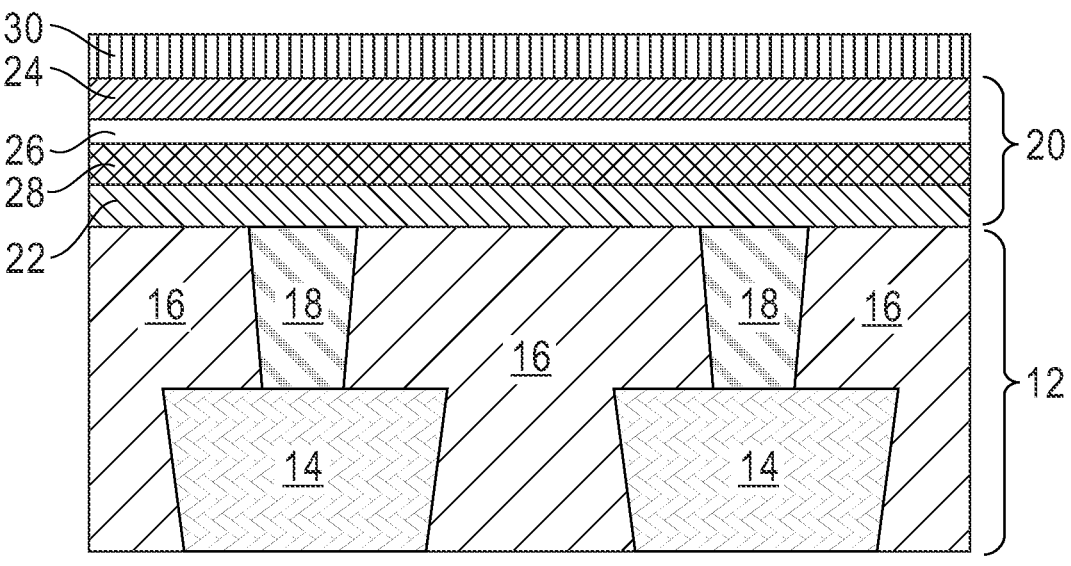
FIG. 1 is a cross-sectional view of back end of line base layers that are formed underneath a magnetic tunnel junction (MTJ) stack of an MRAM device, according to embodiments.

The present disclosure describes MRAM devices including magnetic tunnel junction ("MTJ") stacks and methods of manufacturing MRAM devices. In particular, the present disclosure describes a two-step etching process, one to remove the MTJ stack materials in the field region and a second etching process with a small etch opening. The present disclosure describes an MRAM device composed of MTJ stack pillars with two different underlining dielectric layers having different cross-sectional profiles in the same direction adjacent to the MTJ stack pillars.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.)

are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM ("eDRAM") is a dynamic random-access memory ("DRAM") integrated on the same die or multi-chip module ("MCM") of an application-specific integrated circuit ("ASIC") or microprocessor. eDRAM has been implemented in silicon-on-insulator ("SOI") technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years.

Magnetoresistive random-access memory ("MRAM") devices using magnetic tunnel junctions ("MTJ") are one option to replace existing eDRAM technologies. MRAM is a non-volatile memory, and this benefit is a driving factor that is accelerating the development of this memory technology.

Referring now to the drawings in which like numerals represent the same or similar elements and initially to FIG. 1, an exemplary structure 10 to which the present embodiments may be applied is shown. The structure 10 includes a back end of line ("BEOL") substrate 12 composed of a plurality of layers. In general, the BEOL substrate 12 is the second portion of IC fabrication where the individual devices (transistors, capacitors, resistors, etc.) are interconnected with wiring on the wafer. As shown in FIG. 1, the BEOL substrate 12 includes a BEOL metal layer 14 and a BEOL dielectric layer 16. The BEOL metal layer 14 can include, for example, Cu, TaN, Ta, Ti, TiN or a combination thereof. The BEOL dielectric layer 16 may be composed of, for example, SiOx, SiNx, SiBCN, low-κ NBLOK, or any other suitable dielectric material.

A micro-stud layer 18 is formed on the BEOL metal layer 14. Initially, the micro-stud layer 18 may be formed by patterning the dielectric layer 16 via lithography. Then, a via is formed in via dielectric layer 16 by, for example, RIE to remove a space for subsequent filling with the micro-stud layer 18. In certain embodiments, the micro-stud layer 18 may include a material such as W, Cu, TaN, Ta, Ti, TiN, TiOCN, TaOCN, or a combination of these materials. The micro-stud layer 18 can be formed by CVD, PVD, ALD or a combination thereof. After the micro-stud layer 18 is formed, the structure is subjected to, for example, CMP to planarize the surface for further processing. The structure including the BEOL layers shown in FIG. 1 is a starting structure upon which the MTJ stacks are to be formed.

An MTJ stack 20 is formed on the via dielectric 16 and micro-stud layer 18. In some embodiments, the MTJ stack layer 20 includes a seed layer 22 formed on the via dielectric layer 16. The seed layer 22 has a crystal lattice and grain structure that is suitable as a growth surface for the free layer of the MTJ stack 20. The seed layer 22 can be a metal seed layer composed of Ru, Ta, NiCr or a combination of these materials, for example.

In general, an MTJ stack 20 may include a magnetic free layer 24, a tunnel barrier layer 26 and a reference layer 28 having a fixed magnetic polarity. In general, the magnetic free layer 24 has a magnetic moment or magnetization that can be flipped. In certain embodiments, the tunnel barrier layer 26 is a barrier, such as a thin insulating layer between two electrically conducting materials. Electrons pass through the tunnel barrier 26 by the process of quantum tunneling. In certain embodiments, the tunnel barrier layer 26 is composed of MgO. In certain embodiments, each layer of the MTJ stack 20 may have a thickness less than an angstrom to a thickness of several angstroms or nanometers. Examples of typical materials in an MTJ stack 20 can include MgO for the tunnel barrier layer 26, CoFeB for the free layer 24, and a plurality of layers comprised of different materials for the reference layer 28. It should be appreciated that the MRAM material forming the MTJ stack 20 is not limited to these materials or the layers described above. That is, the MRAM material stack can be composed of any known stack of materials used in MRAM devices. More-over, it should be appreciated that either of the MTJ stack 20 may include additional layers, omit certain layers, and each of the layers may include any number of sublayers.

Figure 2:
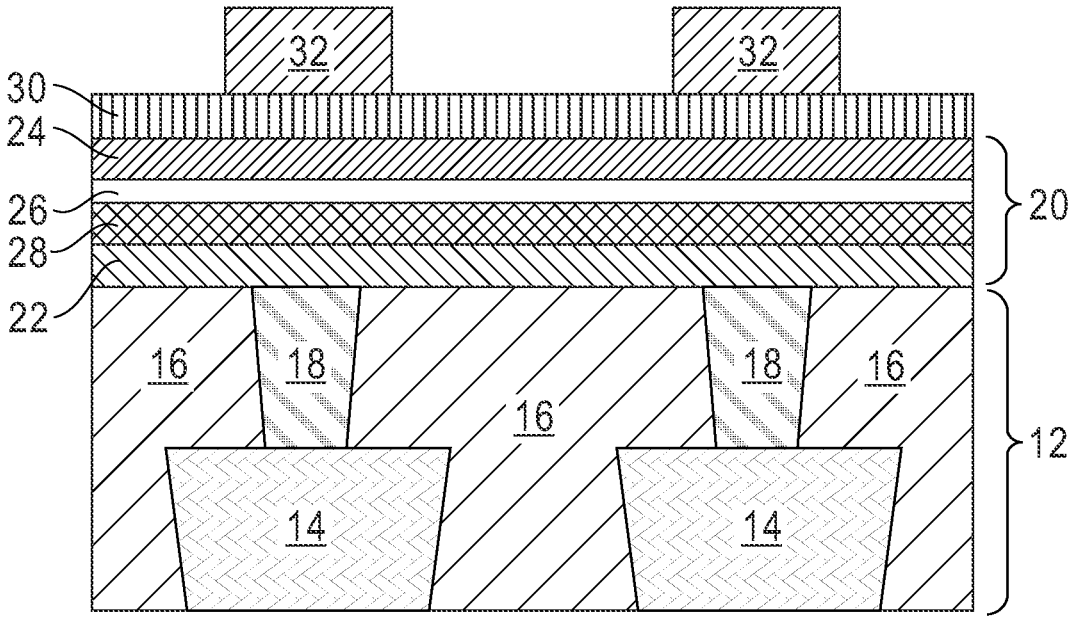
FIG. 2 is a cross-sectional view of the MRAM device of FIG. 1 after additional fabrication operations, according to embodiments.

A hardmask stack 30 is deposited on the MTJ stack 20. In some embodiments, the hardmask stack 30 is composed of a layer of Ta or Ru and a layer of TaN. The hardmask stack 30 is subsequently patterned by lithography and RIE. As shown in FIG. 2, in certain embodiments, an etch pattern layer is patterned to form etch pattern pads 32 composed of organic planarization layer ("OPL") material, an oxide such as $SiN_x$, $SiO_x$, SiARC, a photoresist, or a combination thereof. Initially the material of the etch pattern pads 32 is deposited on the hardmask 30 and then etched by RIE or IBE to form the pattern of pads 32 shown in FIG. 2.

Figure 3:
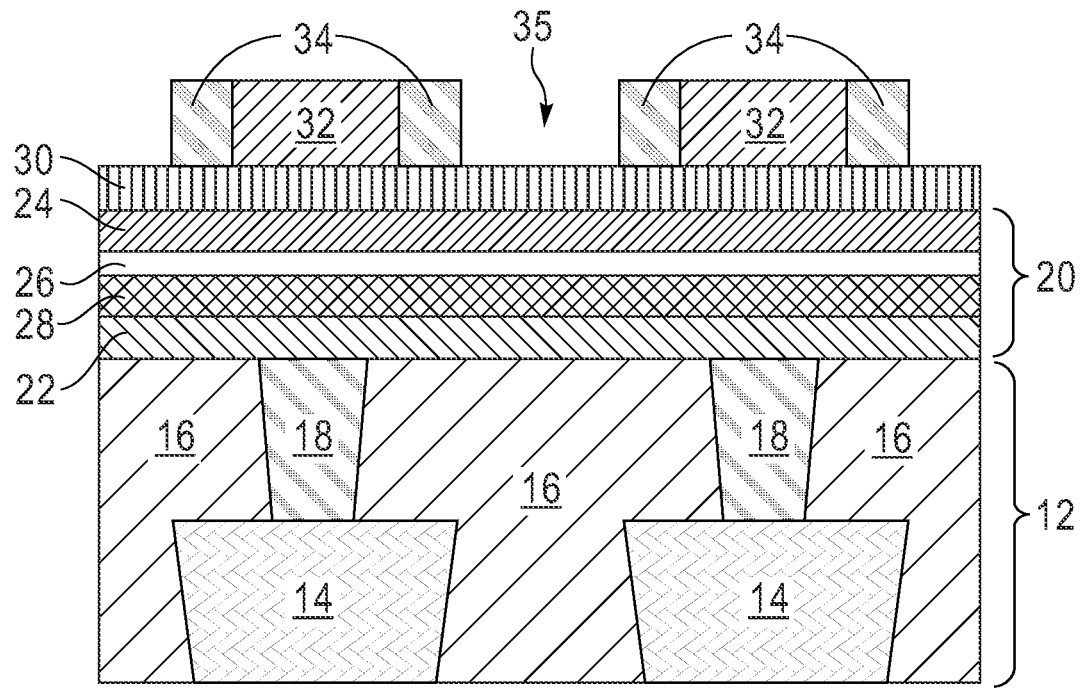
FIG. 3 is a cross-sectional view of the MRAM device of FIG. 2 after additional fabrication operations, according to embodiments.

Referring now to FIG. 3, a spacer 34 is formed on the sidewalls of the etch pattern later 32 forming first openings 35. The spacers 34 can be formed of SiN, SiBCN or SiCN for example, and is generally selected to be etch selective relative to the etch pattern pads 32.

Figure 4:
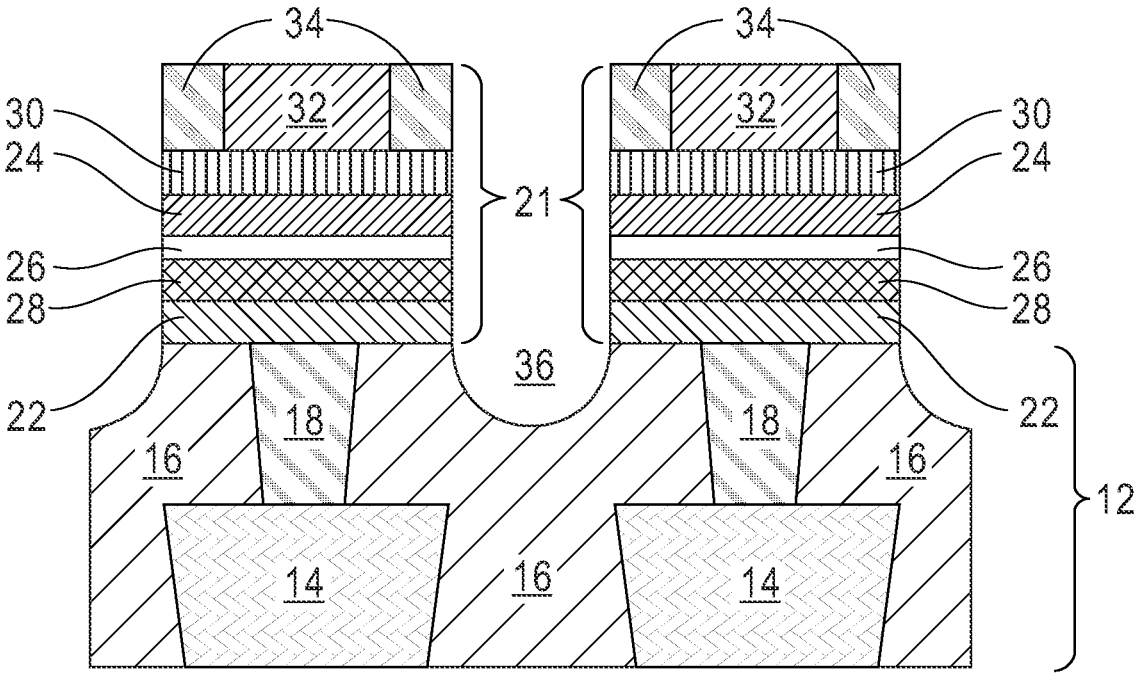
FIG. 4 is a cross-sectional view of the MRAM device of FIG. 3 after additional fabrication operations, according to embodiments.

Referring now to FIG. 4, the MTJ stack 20 is patterned with a first IBE while utilizing the etch pattern pads 32 with the spacer 34 for the pattern to form first MTJ pillars 21. As shown in FIG. 4, the etching is stopped inside (or near the top of) the dielectric layer 16. In some embodiments, the MTJ stack 20 is patterned by IBE at multiple angles or RIE or a combination thereof. Thus, after the etching procedure, multiple first MTJ pillars 21 are formed separated by a via 36. A non-aggressive or mild IBE in the opening 35 may be used considering that this IBE is not for the final MTJ pillar formation. In some embodiments, the IBE may use a low bias voltage for a short time.

Figure 5:
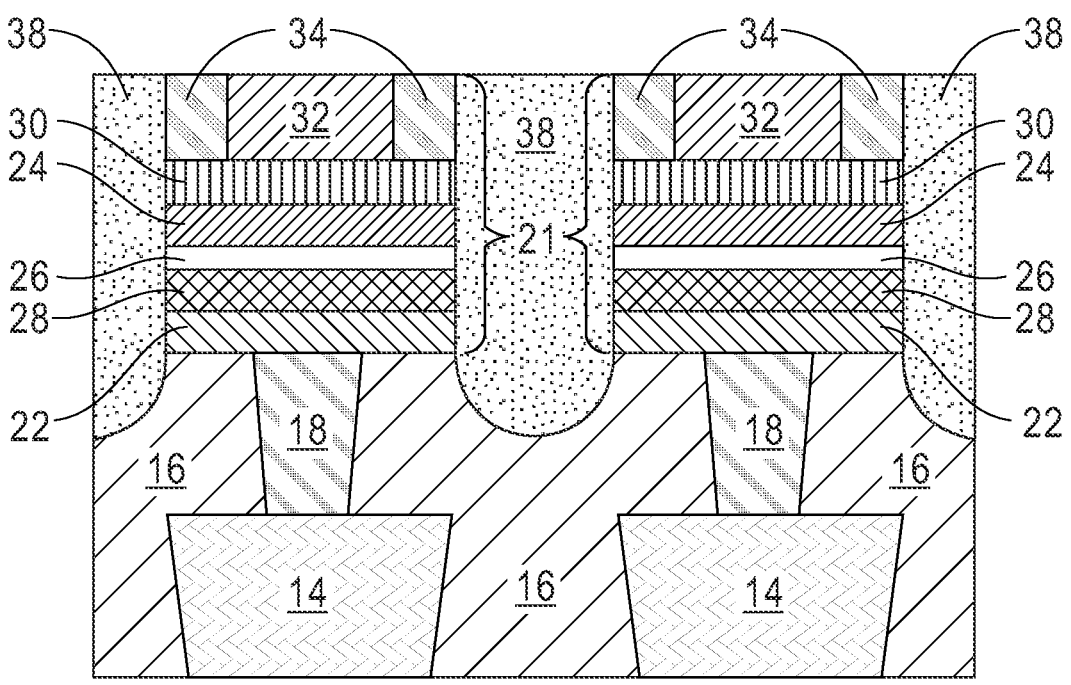
FIG. 5 is a cross-sectional view of the MRAM device of FIG. 4 after additional fabrication operations, according to embodiments.

Referring now to FIG. 5, a first dielectric layer 38 is deposited to fill the via 36. This first dielectric layer 38 may be composed of any suitable ILD Oxide, low-κ, flowable oxide. In some embodiments, the first dielectric layer 38 has a very low stick coefficient to MTJ pillar so that it can be easily removed from the surface of the first MTJ pillars 21. In some embodiments the dielectric material may be composed of low quality SiN, SiBCN, SiON, SiOx, SiCON, or a combination thereof, so that it can be vulnerable to damage caused by IBE etching. The first dielectric layer 38 is deposited to a sufficient height to cover the sidewalls of the spacer 34 and top surfaces of the spacer 34 and etch pattern pads 32. Following the dielectric fill of via 36, CMP is performed to expose the top surfaces of the etch pattern pads 32 with spacers 34.

Figure 6:
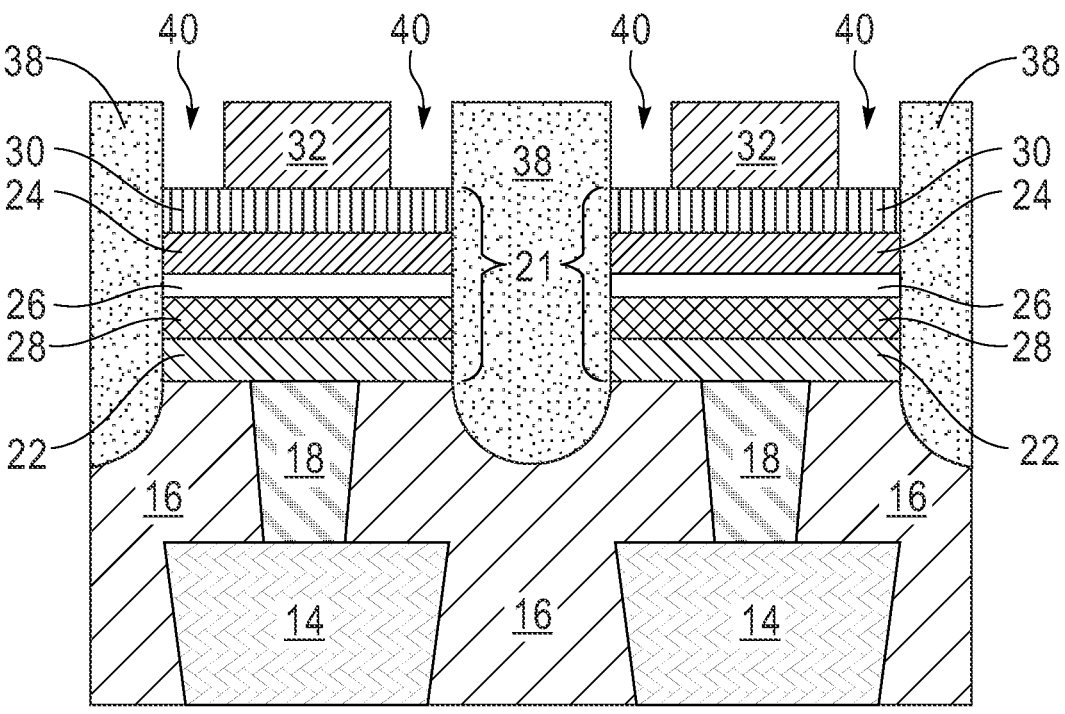
FIG. 6 is a cross-sectional view of the MRAM device of FIG. 5 after additional fabrication operations, according to embodiments.

Referring now to FIG. 6, the spacers 34 are removed leaving etch openings 40 on both sides of the etch pattern pads 32. The etch openings 40 are smaller than the first openings 35. The spacers are removed using selective RIE or a suitable wet or dry etch process. In some embodiments, the spacers are removed to define the etch openings 40 to have nearly vertical etch slopes or nearly vertical contact angles. By use of the terms "nearly vertical etch slope" or "nearly vertical contact angle" is meant an angle defined by the sidewall of the opening being formed of at least 80 degrees, preferably about 90 degrees, with the plane of the top of etch pattern 32.

Figure 7:
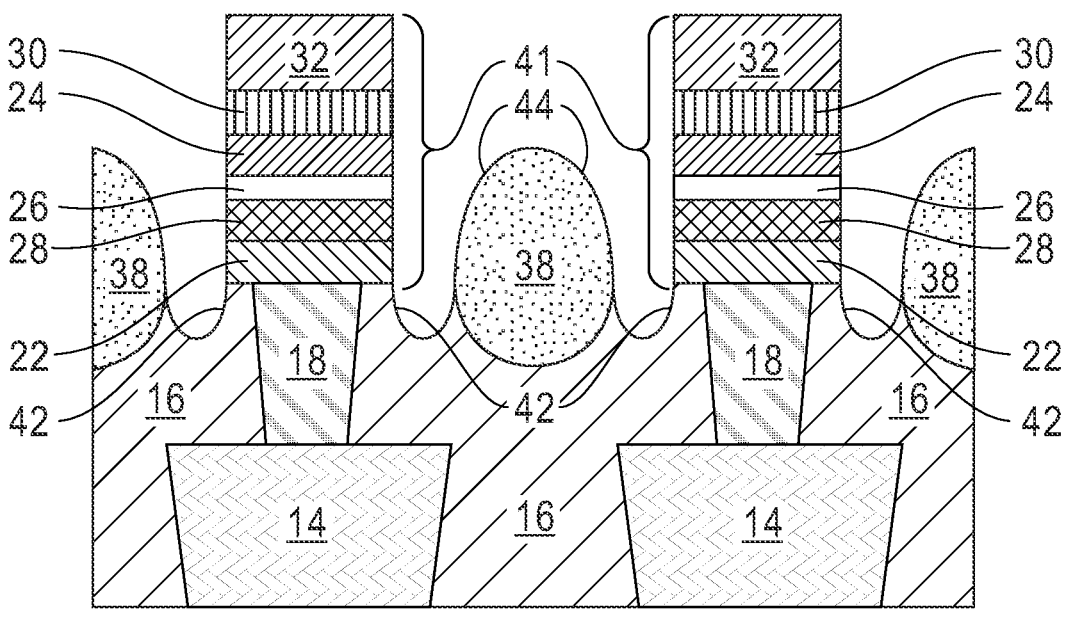
FIG. 7 is a cross-sectional view of the MRAM device of FIG. 6 after additional fabrication operations, according to embodiments.

As shown in FIG. 7, a second IBE is performed to etch the first MTJ pillars 21 while utilizing the etch pattern pads 32 without the spacer 34 for the pattern to form second MTJ pillars 41. As shown in FIG. 7, the etching is stopped inside (or near the top of) the dielectric layer 16 forming vias 42 between the MTJ pillars 41 and the first dielectric 38. The IBE budget can be much higher because the smaller etch openings 40 results in less gauging into the dielectric 16. The second IBE therefore can be more aggressive using a higher bias voltage for a longer time with straighter angle of etch than the first IBE etch. No extra lithography process is needed. The pre-filled sacrificial dielectric 38 will be eroded during the second IBE etch, such that two second vias 42 are formed between pairs of MTJ second pillars 41. The dielectric 38 also acts as a protection layer for the NBLOK layer 16 below. Therefore, due to the small openings 40, the NBLOK loss during this second IBE step will be minimal compared with conventional MTJ stack patterning that is done with a much larger opening. Due to the erosion of the first dielectric 38, the top 44 of the openings 40 will be wider, which will be beneficial for the angled IBE clean up etch to follow.

Figure 8:
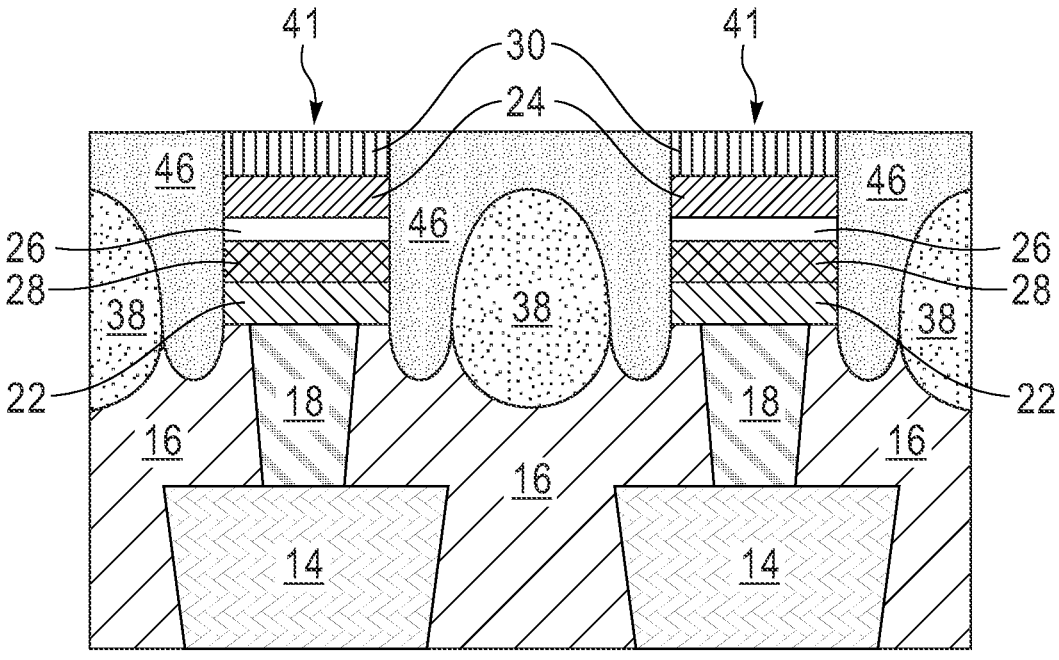
FIG. 8 is a cross-sectional view of the MRAM device of FIG. 7, after additional fabrication operations, according to embodiments.

A dielectric encapsulation layer 46 is formed to fill the vias 42 to cover the exposed surfaces of the MTJ second pillars 41 and the etch pattern pads 32 followed by a CMP planarization process. As shown in FIG. 8, the CMP exposes upper surfaces of the second MTJ pillar 41 and the dielectric encapsulation layer 46. For example, the dielectric encapsulation layer 46 may comprise at least one of PVD, ALD, PECVD, AlOx, $TiO_x$, BN, SiN and SiBCN.

Figure 9:
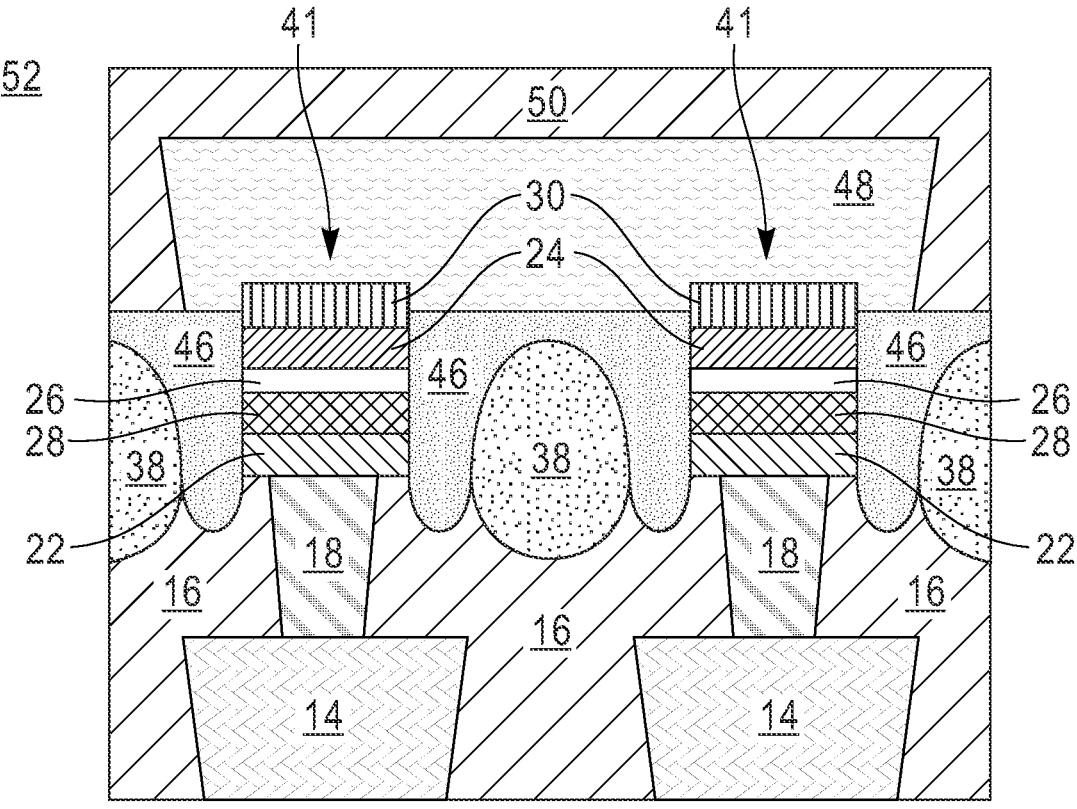
FIG. 9 is a cross-sectional view of the MRAM device of FIG. 8, after additional fabrication operations according to embodiments.

Referring now to FIG. 9, following the CMP planarization process, a metal contact layer 48 is formed by conventional lithography on the exposed surfaces of the encapsulation layer 46 and the second MTJ pillar 41. In some embodiments, following the formation of the metal contact layer 48, a second ILD or NBLOK layer 50 is formed to cover the top surface of the metal contact layer 48. In certain embodiments, the metal contact layer 48 is composed of Ta, TaN, Cu, or any suitable combination thereof. In some embodiments, as shown in FIG. 9, as portion of the encapsulation layer 46 is removed using selective RIE or other suitable wet or dry etch to cause the metal contact layer to be formed on the sides of the metal hardmask layer 30 of the second MTJ pillar 41.

The final MRAM device 52 shown in FIG. 9 is composed of the second MTJ stack pillars 41 with two different underlining dielectric layers 38 and 46 having different cross-sectional profiles adjacent to the second MTJ stack pillars 41. The MRAM device 52 is formed using a two-step etching process, one to remove the MTJ stack materials in the field region using etch opening 36 shown in FIG. 4, and a second etching process using a smaller etch opening 40 shown in FIG. 6. The two different dielectric fills 38 and 46 adjacent to the MTJ pillars results in better retention of the underlining NBLOK 16. Dielectric layer 38 is an eroded middle sacrificial dielectric between the second MTJ pillars 41.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An MRAM device having magnetic tunnel junction (MTJ) pillars, comprising:
   a plurality of MTJ pillars on a substrate;
   a first dielectric between pairs of MTJ pillars defining two vias between each pair of MTJ pillars; and
   a second dielectric filling the pairs of vias and encapsulating the plurality of MTJ pillars, wherein the second dielectric is in contact with a sidewall of the pairs of pillars and is located around, and on top of, the first dielectric.

2. The MRAM device according to claim 1, wherein the first dielectric is formed by a first etch using a first bias voltage for a first time and the second dielectric is formed by a second etch using a second bias voltage for a second time, the second bias voltage being higher than the first bias voltage and the second time being longer than the first time.

3. The MRAM device according to claim 1, wherein, the two vias between each pair of MTJ pillars are wider at the top than at the bottom.

4. The MRAM device according to claim 1, wherein a cross-sectional profile of the first dielectric in a first direction is different from a cross-sectional profile of the second dielectric in the first direction.

5. The MRAM device according to claim 1, wherein the first dielectric and the second dielectric are composed of different materials.

6. The MRAM device according to claim 1, further comprising a metal contact layer on the plurality of MTJ pillars.

7. The MRAM device according to claim 1, wherein the plurality of MTJ pillars comprise a magnetic free layer on one side of a tunnel barrier layer and a reference layer having a fixed magnetic polarity on an opposite side of the tunnel barrier layer.

8. The MRAM device of claim 7, wherein the MTJ pillar further comprises a seed layer between the substrate and the plurality of MTJ pillars.

9. The MRAM device of claim 8, wherein the MTJ pillar further comprises a metal hardmask layer on the magnetic free layer.

10. The MRAM device of claim 1, wherein the first dielectric is oval in shape.

* * * * *